United States Patent [19]

Smith et al.

[11] Patent Number: 4,546,328

[45] Date of Patent: Oct. 8, 1985

[54] PLL SWEPT FREQUENCY GENERATOR WITH PROGRAMMABLE SWEEP RATE

[75] Inventors: Edwin B. Smith, Kwajalein Atoll, Trust Ter. Pacific Isl.; John R. Fogleboch, Sr., Cherry Hill, N.J.

[73] Assignee: The United States of America as represented by the Secretary of the Air Force, Washington, D.C.

[21] Appl. No.: 497,447

[22] Filed: May 23, 1983

[51] Int. Cl.⁴ .............................................. H03L 7/08
[52] U.S. Cl. .......................................... 331/4; 331/10; 331/17; 331/25; 331/178
[58] Field of Search ............... 331/4, 10, 17, 25, 178

[56] References Cited

U.S. PATENT DOCUMENTS

| | | | |
|---|---|---|---|
| 2,831,974 | 4/1958 | Wright et al. | 250/36 |
| 3,382,460 | 5/1968 | Blitz et al. | 331/178 |
| 4,096,445 | 6/1978 | Hopwood et al. | 331/17 |
| 4,130,808 | 12/1978 | Marzalek | 331/4 X |
| 4,159,475 | 6/1979 | Andre et al. | 343/5 AF |
| 4,160,958 | 7/1979 | Mims et al. | 331/4 X |
| 4,336,511 | 6/1982 | Stromswold et al. | 331/4 X |
| 4,442,412 | 4/1984 | Smith et al. | 331/25 X |

Primary Examiner—Eugene R. Laroche
Assistant Examiner—D. C. Mis
Attorney, Agent, or Firm—Donald J. Singer; William Stepanishen

[57] ABSTRACT

A phase-locked voltage controlled oscillator for generating frequency modulated waveforms having a programmable digital RF phase shifter to determine the phase difference between the output signal and a phase corrected reference signal to thereby generate the desired output waveform.

7 Claims, 2 Drawing Figures

PLL SWEPT FREQUENCY GENERATOR WITH PROGRAMMABLE SWEEP RATE

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a voltage-controlled oscillator, and in particular to a phase-locked voltage-controlled oscillator apparatus for linear or complex frequency modulated waveforms.

It is well known in the prior art that an oscillator is an electronic circuit that converts energy from a direct current source into a periodically varying electrical output. If the output voltage is a sinewave function of time, the generator is called a sinusoidal, or harmonic oscillator. If the oscillator output waveform contains abrupt changes in voltage, such as occur in a pulse or square wave, the device is called a relaxation oscillator.

The fundamental laws governing sinusoidal oscillators are the same for all oscillator circuits. The amplifier provides an output voltage $v_o$ as a consequence of an external input signal voltage $v_s$. The voltage vo is applied to a circuit which is called a feedback network and which has an output that is $v_f$. If the feedback voltage $v_f$ were made identically equal to the input voltage $v_s$, and if the external input were disconnected and the feedback voltage connected to the amplifier input terminals, the amplifier would continue to provide the same output voltage $v_o$ as before. This requires that the instantaneous values of $v_f$ be exactly equal at all times. Since no restriction was made on the waveform, it need not necessarily be sinusoidal.

If the entire circuit operates linearly and the amplifier or feedback network or both contain reactive elements, the only periodic wave that will preserve its form is the sinusoidal waveform, and such a circuit will be called a sinusoidal oscillator. For sinusoidal oscillators, the condition where $v_s$ equals $v_f$ requires that amplitude, phase, and frequency of $v_s$ and $v_f$ be identical. The phase shift introduced in a signal while being transmitted through a reactive network is invariably a function of the frequency, and there is usually only one frequency at which $v_f$ and $v_s$ are in phase. Therefore, a sinusoidal oscillator operates at the frequency for which the total phase shift of the amplifier and feedback network is precisely zero (or an integral multiple of 2). The frequency of a sinusoidal oscillator, provided the circuit oscillates at all, is therefore determined by the condition that the loop phase shift is zero.

SUMMARY OF THE INVENTION

The present invention utilizes a programmable digital RF phase shifter circuit to provide a feedback reference signal to a voltage controlled oscillator wherein the phase of the feedback reference signal to the oscillator may be controlled to establish a linear frequency modulated slope reference signal.

It is one object of the present invention, therefore, to provide an improved phase-locked voltage controlled oscillator apparatus.

It is another object of the present invention to provide an improved phase-locked voltage controlled oscillator apparatus for generating either linear or complex frequency waveforms. It is yet another object of the present invention to provide an improved phase-locked voltage controlled oscillator apparatus for phase locking a linear frequency modulated output signal to the basic oscillator frequency reference. It is still another object of the present invention to provide an improved phase-locked voltage controlled oscillator apparatus wherein a programmable digital RF phase shifter is utilized to control the frequency reference to the oscillator.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
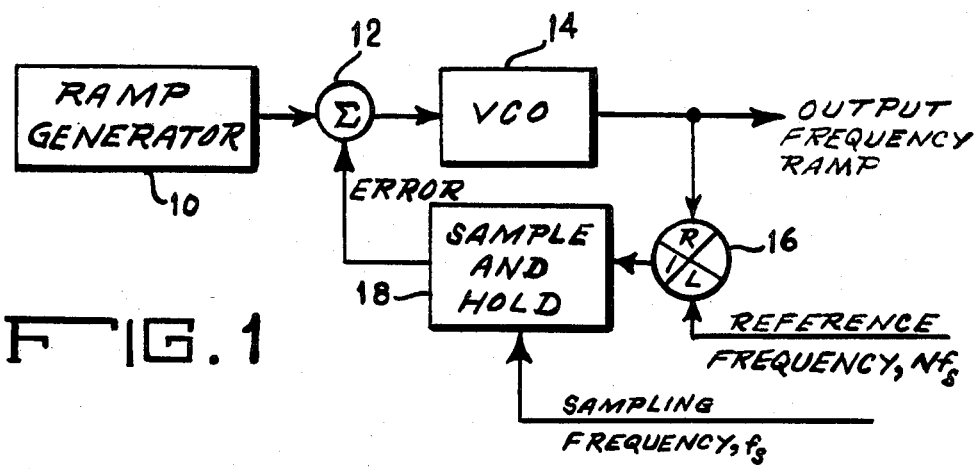
FIG. 1 is a block diagram of the phase-locked voltage controlled oscillator apparatus according to the present invention.

Referring now to FIG. 1, there is shown a block diagram of the phase-locked voltage controlled oscillator apparatus for generating either linear or complex modulated waveforms. A ramp generator unit 10 generates a ramp output signal which is applied to the summing unit 12. The summing unit 12 combines the ramp output signal with an error signal and applies a voltage control signal to the voltage controlled oscillator unit 14. The output signal from the voltage controlled oscillator unit 14 is a frequency ramp signal. The frequency ramp signal is applied to a phase comparator unit 16 wherein it is compared with a reference frequency, $Nf_s$. The phase reference signal from the phase comparator unit 16 is applied to the sample and hold unit 18 which receives a sampling frequency, $f_s$. The output signal from the sample and hold unit 18 is the error signal which is applied to the summing unit 12.

The present invention utilizes a technique for the phase locking of a linear frequency modulated (LFM) waveform to a basic frequency reference. A voltage controlled oscillator (VCO) generates the linear frequency modulated waveform as an output signal. The present apparatus includes a programmable digital RF phase shifter in the frequency reference loop wherein the reference phase may be modified such that the linear frequency modulated waveform slope ($\Delta f/\Delta t$) is not restricted in slope value. The basic concept of phase locking a voltage controlled oscillator (VCO) to a CW reference source is not new. However, if the output of the voltage controlled oscillator approximates a desired linear frequency modulated waveform by reason of a voltage ramp being applied to its input, a phase locked loop may be closed around the voltage controlled oscillator to lock the output phase to a sampled CW reference whose phase progresses according to the exact quadratic. This forms the basis of the present invention.

Any linear FM waveform follows the quadratic phase function $\phi(t)$ which is given according to the equation:

$$\phi(t) = W_s t + \pi B/T \ t^2 + \phi_c$$

where:

W_s = starting frequency

B = bandwidth of linear frequency modulated waveform pulse

T = length of linear frequency modulated waveform pulse $\phi_c$ = phase constant If this phase function is sampled at regular intervals t, there is a discrete value for t at which every sample point will be a multiple of $2\pi$:

$$B/T(\Delta t)^2 = 2$$

$$(\Delta t)^2 = 2T/B = 2/\text{slope}$$

This, then, provides a simple means of phase comparing a linear frequency modulated waveform against a known phase reference. It is first provided that the sampling frequency, $f_s = 1/\Delta t$ bears the above relationship with the slope, and second that $W_s$ is an integral multiple of $f_s$, and thirdly that $\phi_c = 0$, then every sampled point of the waveform will be a zero crossing, i.e.: the phase reference is always zero. This circuit configuration was shown in FIG. 1 and is one means of utilizing the phase error in a closed loop to make B/T equal to a constant.

The above circuit is a workable, although very restrictive, method of generating and phase locking a linear FM waveform. It is restrictive in that the slope, sampling frequency, and $W_s$ are very critically related and that, given practical bounds for $f_s$, only a few discrete slopes can be generated. In order to expand the choices of $f_s$ and slope, the phase reference mechanism can be made more complex by the addition of a digital phase shifter. This allows the phase at the sample points to be binary subdivisions of $2\pi$, i.e., $\pi, \pi/2, \pi/4$, etc. By programming the phase shifter to match the phase of the perfect quadratic at each sample point, a reference signal may be generated for the phase comparator. With this approach, the relationship between $f_s$ and slope becomes:

$$f_s^2 = (\text{slope})(2^{n-1})$$

where:

$f_s$ = sampling frequency

N = number of bits in modulo $2\pi$ phase shifter.

This enhances the capability of the linear frequency modulated waveform generator by considerably increasing the number of discrete slopes which may be generated while it is still restricted to those discrete slopes.

Figure 2:
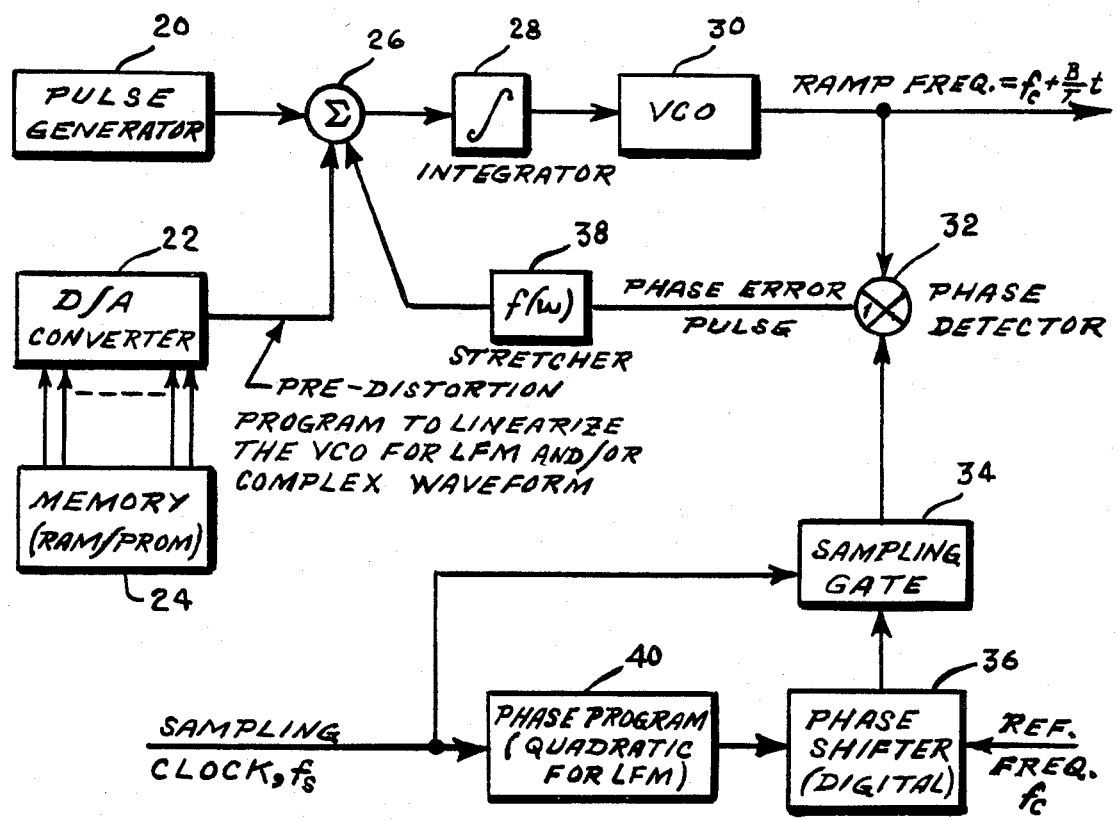
FIG. 2 is a block diagram of a phase-locked voltage controlled oscillator apparatus utilizing a programmable digital RF phase shifter.

Turning now to FIG. 2, there is shown a block diagram of the phase-locked voltage controlled oscillator apparatus wherein a digital phase shifter is utilized to establish the reference signal to the voltage controlled oscillator. The pulse generator unit 20 provides pulse signals to the summing unit 26. A memory unit 24 which may be either a random access memory (RAM) or a programmable read only memory (PROM) stores a pre-distortion program which will be utilized to linearize the voltage controlled oscillator unit 30. The data from the memory unit 24 is applied to the digital/analog (D/A) converter unit 22 wherein it is converted to an analog signal and applied to the summing unit 26. The output signal from the summing unit 26 is integrated in integrator unit 28 and is applied to the voltage controlled oscillator unit 30. The output from the voltage controlled oscillator unit 30 comprises a ramp frequency which equals $f_c + (B/T)t$.

The phase shift circuit of the phase-locked voltage controlled oscillator apparatus comprises a phase locked loop from the output of the voltage controlled oscillator unit 30 to the summing unit 26. The phase shift circuit utilizes a phase program unit 40 wherein the phase program comprising the quadratic functions which are necessary for the linear frequency modulation are stored. The output from the phase program unit 40 is applied to the digital phase shifter unit 36 which receives a reference frequency, $f_c$. The output from the phase shifter unit 36 is applied to the sampling gate unit 34. A sampling clock signal, $f_s$, is applied to both the phase program unit 40 and the sampling gate unit 34. The output from the sampling gate unit 34 is applied to the phase detector unit 32 which also receives the ramp frequency signal from the voltage controlled oscillator unit 30. The output of the phase detector unit 32 which comprises phase error pulses, is applied to the pulse stretcher unit 38. The pulse stretcher unit 38 utilizes some pulse stretching function, f(w) to stretch the incoming phase error pulses. The output from the pulse stretcher unit 38 is applied to the summing unit 26 wherein the phase error signal is combined with the output from the pulse generator unit 20 and the memory unit 24 to provide a voltage control signal for the voltage controlled oscillator unit 30.

The operation of the phase-locked voltage controlled oscillator apparatus, utilizing a phase shifter with more than N bits (N as restricted by the above equation) is as follows. Present state of the art in fast digital phase shifters allows up to 8 bits of modulo 2 or 1.4 degrees least significant bit (LSB). If it is required to generate any arbitrarily chosen slope, B/T, with an independently chosen sampling interval, $\Delta t$, the exact quadratic phase values at times N ($\Delta t$) may be calculated. A programmable read only memory (PROM) is then programmed with those digital values which are closest to the exact value. The maximum error is then LSB/2. With the voltage controlled oscillator (VCO) being forced with a voltage ramp which causes the voltage controlled oscillator (VCO) output frequency slope to be close to the calculated slope and the phase shifter following the programmable read only memory (PROM) program, the closed loop will cause the output phase to follow the precalculated phase within a maximum error of LSB/2.

The present apparatus may be utilized to generate frequency vs time waveforms which are more complex than linear by generating the proper phase program (in the programmable read only memory, other memory, or real-time digital means) and forcing the voltage controlled oscillator to the approximate output waveform by a pre-distorted voltage drive function. The pre-distorted drive function can be reliably generated by a D/A converter driven by a digital memory (RAM or PROM) loaded with the pre-distortion program.

Although the invention has been described with reference to a particular embodiment, it will be understood to those skilled in the art that the invention is capable of a variety of alternative embodiments within the spirit and scope of the appended claims.

What is claimed is:

1. A phase-locked voltage controlled oscillator apparatus comprising in combination:

means for generating a waveform, said waveform generating means providing an output signal, a means for summing to receive said output signal from said waveform generating means, said summing means summing said output signal with an error signal to provide a voltage signal, a voltage-controlled oscillator receiving said voltage signal from said summing means, said voltage-controlled oscillator providing a frequency output in response to said voltage signal, and, a phase-locked loop connected between the output of said voltage-controlled oscillator and said summing means, said phase-locked loop receiving said frequency output and a reference frequency, said phase-locked loop receiving a sampling frequency, said phase-locked loop sampling the phase difference between said frequency output and said reference frequency at the rate of said sampling frequency and generating a phase error signal proportional to said phase difference to correct said frequency output at said rate of said sampling frequency during the generation of said waveform therebetween.

2. A phase-locked voltage controlled oscillator apparatus as described in claim 1 wherein said phase-locked loop comprises in combination:

a phase program means for storing the quadratic parameters for a linear frequency modulated waveform, a phase shifter means receiving a reference frequency and the quadratic parameters from said phase program means, said phase shifter adjusting the phase of said reference frequency in accordance with said quadratic parameters and generating a phase reference signal, a means for sampling the output from said phase shifter means, said sampling means and said phase program means respectively receiving a sampling clock signal, said sampling means sampling said phase reference signal at the rate of said sampling clock signal, a means for detecting phase connected to said sampling means to receive said phase reference signal therefrom, said phase detecting means receiving said frequency signal from said voltage-controlled oscillator, said phase detecting means detecting said phase difference between said frequency signal and said phase reference signal and generating said phase error signal in proportion to the phase difference therebetween, and a pulse stretcher means to receive said phase error signal from said phase detector means, said pulse stretcher means stretching said phase error signal in accordance with a predetermined signal stretching function, said pulse stretcher means applying said phase error signal to said summing means.

3. A phase-locked voltage controlled oscillator apparatus as described in claim 1 wherein said waveform generating means comprises a ramp generator.

4. A phase-locked voltage controlled oscillator apparatus as described in claim 2 wherein said frequency output of said voltage-controlled oscillator comprises an output frequency ramp.

5. A phase-locked voltage controlled oscillator apparatus as described in claim 2 further including a memory means for storing pre-distortion program parameters for linear and complex frequency modulated waveforms, and, a digital to analog converter means to convert said program parameters from said memory means to an analog signal, said digital to analog converter means applying said analog signal to said summing means.

6. A phase-locked voltage controlled oscillator apparatus as described in claim 5 wherein said memory means comprises a random access memory.

7. A phase-locked voltage controlled oscillator apparatus as described in claim 5 wherein said memory means comprises a programmable read only memory.

* * * * *